United States Patent
Val et al.

(10) Patent No.: US 7,635,639 B2
(45) Date of Patent: Dec. 22, 2009

(54) METHOD FOR THE INTERCONNECTION OF ACTIVE AND PASSIVE COMPONENTS AND RESULTING THIN HETEROGENEOUS COMPONENT

(75) Inventors: Christian Val, St Remy les Chevreuse (FR); Olivier Lignier, Versailles (FR)

(73) Assignee: 3D Plus, Buc (FR)

( * ) Notice: Subject to any disclaimer, the term of this patent is extended or adjusted under 35 U.S.C. 154(b) by 116 days.

(21) Appl. No.: 10/562,685

(22) PCT Filed: Jun. 30, 2004

(86) PCT No.: PCT/EP2004/051314
§ 371 (c)(1), (2), (4) Date: Jul. 24, 2006

(87) PCT Pub. No.: WO2005/004237
PCT Pub. Date: Jan. 13, 2005

(65) Prior Publication Data
US 2007/0117369 A1    May 24, 2007

(30) Foreign Application Priority Data
Jul. 1, 2003    (FR) .................................. 03 07977

(51) Int. Cl.
*H01L 21/46* (2006.01)

(52) U.S. Cl. ........................ 438/459; 438/106; 438/464; 257/E23.001

(58) Field of Classification Search .................. 438/52, 438/106–127, 612–622, 459, 464; 257/678, 257/684–728
See application file for complete search history.

(56) References Cited

U.S. PATENT DOCUMENTS

| 3,235,939 A | 2/1966 | Rodriguez et al. |
| 4,755,910 A | 7/1988 | Val |
| 5,323,533 A | 6/1994 | Val |
| 5,324,687 A | 6/1994 | Wojnarowski |
| 5,400,218 A | 3/1995 | Val |
| 5,497,033 A * | 3/1996 | Fillion et al. ................. 257/723 |
| 5,526,230 A | 6/1996 | Val |
| 5,637,536 A | 6/1997 | Val |
| 5,640,760 A | 6/1997 | Val et al. |

(Continued)

FOREIGN PATENT DOCUMENTS

EP    0 611 129 A    8/1994

(Continued)

*Primary Examiner*—Ha Tran T Nguyen
*Assistant Examiner*—Daniel Whalen
(74) *Attorney, Agent, or Firm*—Lowe Hauptman Ham & Berner, LLP

(57) ABSTRACT

A method for interconnecting active and passive components in two or three dimensions, and the resulting thin heterogeneous components. The method comprises: positioning and fixing (11) at least one active component and one passive component on a flat support (23), the terminals being in contact with the support, depositing (12) a polymer layer (24) on all of the support and the components, removing the support (14), redistributing the terminals (15) between the components and/or toward the periphery by metal conductors (26) arranged in a predetermined layout, making it possible to obtain a heterogeneous reconstituted structure, heterogeneously thinning (16) the structure by nonselective surface treatment of the polymer layer and at least one passive component (22).

9 Claims, 6 Drawing Sheets

U.S. PATENT DOCUMENTS

| | | | |
|---|---|---|---|
| 5,847,448 A | 12/1998 | Val et al. | |
| 5,885,850 A | 3/1999 | Val | |
| 6,307,261 B1 | 10/2001 | Val et al. | |
| 6,441,495 B1 * | 8/2002 | Oka et al. | 257/777 |
| 6,716,672 B2 | 4/2004 | Val | |
| 6,809,367 B2 | 10/2004 | Val | |
| 7,134,198 B2 * | 11/2006 | Nakatani et al. | 29/841 |
| 2002/0151103 A1 * | 10/2002 | Nakamura et al. | 438/106 |
| 2002/0175400 A1 | 11/2002 | Gerber et al. | |
| 2003/0045030 A1 | 3/2003 | Hayashida et al. | |
| 2003/0222335 A1 * | 12/2003 | Hirano et al. | 257/678 |

FOREIGN PATENT DOCUMENTS

| | | |
|---|---|---|
| EP | 1 137 066 A | 9/2001 |
| FR | 2 818 804 A | 6/2002 |
| WO | 02 15266 A | 2/2002 |

* cited by examiner

METHOD FOR THE INTERCONNECTION OF ACTIVE AND PASSIVE COMPONENTS AND RESULTING THIN HETEROGENEOUS COMPONENT

RELATED APPLICATIONS

The present Application is based on International Application No. PCT/EP2004/051314, filed on Jun. 30, 2004, which in turn corresponds to FR 03/07977 filed on Jul. 1, 2003, and priority is hereby claimed under 35 USC §119 based on these applications. Each of these applications are hereby incorporated by reference in their entirety into the present application.

FIELD OF THE INVENTION

1. Technical Field

The present invention relates to a method for the interconnection of active and passive components in two or three dimensions, and to the resulting thin heterogeneous components.

2. Background of the Invention

There is a very great trend toward thinning components and, more particularly, active components of the semiconductor "chip" type. As regards passive components, and in particular capacitors, only capacitors deposited on a substrate (glass, alumina, silicon) can have thicknesses comparable to those of thinned active components. The drawback of these deposited capacitors derives from their very low permittivity, which ranges from 4 to a few tens, while the permittivities of ceramic capacitors reach several thousand. The latter capacitors based on barium titanate are very stable and very reliable. Manufacturers have so far been trying to reduce their thickness, and it has now reached 0.5 to 0.6 mm. For applications of the stacking of components in three dimensions, however, it is becoming possible to stack thinned chips measuring 150, 100 or even 50 microns. This is not compatible with the thicknesses of 500 to 600 microns for contemporary ceramic capacitors. Yet, in order to decouple digital chips, it is necessary to provide several capacitors per chip with capacitances of 100 to 200 nanofarads. Only ceramic capacitors can make it possible to obtain such values in reduced surface dimensions (for example 1 to 2 $mm^2$)

SUMMARY OF THE INVENTION

The present invention makes it possible to overcome the aforementioned drawbacks by providing a method for the interconnection of active and passive components, which is applicable particularly to the interconnection of chip-type active components and ceramic capacitors, making it possible to produce thin heterogeneous components in two or three dimensions. The method is based on simultaneously thinning the active and passive components coated in a polymer layer by a surface treatment which is heterogeneous, i.e. applied nonselectively both to the passive and active components and to the polymer layer coating them, the Applicant having shown that surprisingly this method does not significantly affect the performance of the passive components, including ceramic capacitors.

More precisely, the invention relates to a method for the interconnection of active and passive components provided with terminals for their interconnection, characterized in that it comprises:

positioning and fixing at least one active component and one passive component on a flat support, the terminals being in contact with the support, depositing a polymer layer on all of the support and said components, removing the support, redistributing the terminals between the components and/or toward the periphery by means of metal conductors arranged in a predetermined layout, making it possible to obtain a reconstituted heterogeneous structure, heterogeneously thinning said structure by nonselective surface treatment of the polymer layer and at least one passive component.

BRIEF DESCRIPTION OF THE DRAWINGS

Other advantages and characteristics will become more apparent on reading the following description, illustrated by the appended figures in which.

In these figures, references which are the same refer to identical elements. Furthermore, the true scale has not been respected for the sake of clarity in the drawings.

DETAILED DESCRIPTION

Figure 1:
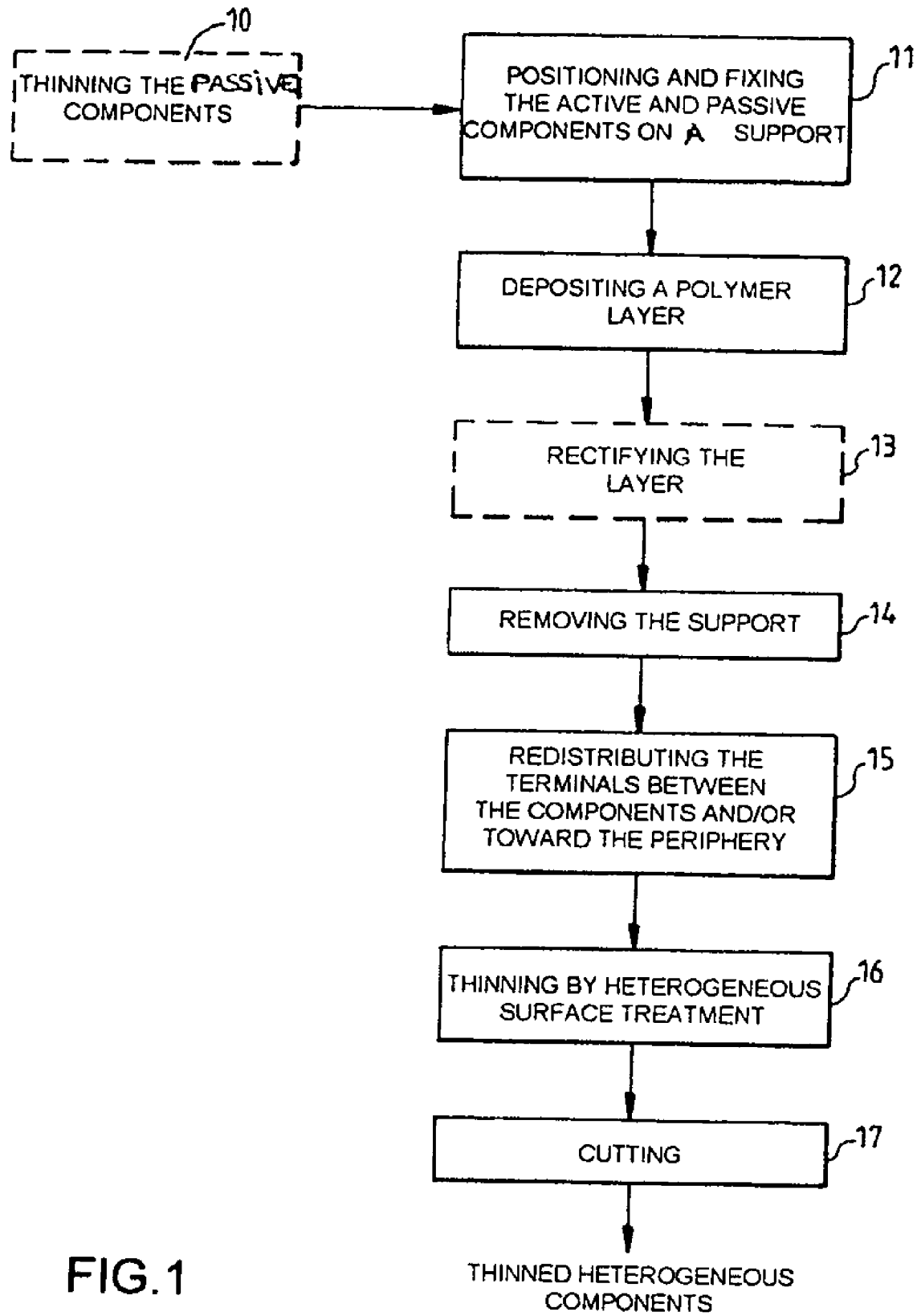
FIG. 1 represents an embodiment of the method according to the invention.

FIG. 1 describes an embodiment of the method according to the invention for interconnecting active and passive components, in particular for the production of very thin heterogeneous components in three dimensions. The term heterogeneous component is intended to mean an electronic component comprising both one or more active and passive component(s) connected together with a view to forming an electronic component in order to fulfill a given electronic function. The active component comprises any component commonly referred to as a "chip" and employing semiconductor technology, for example of the diode, transistor or integrated circuit type. The term passive component is intended to mean the other components, whether conventional components of the resistor, capacitor or inductor type mounted at the surface, or alternatively electromechanical components etched in silicon and known by the name MEMS (abbreviation for "MicroElectroMechanical Systems"). As explained above, the thickness of the passive components and in particular ceramic capacitors, of the order of 500 to 600 microns, limits the possibility of thinning the heterogeneous components, and in particular three-dimensional heterogeneous components. The method according to the invention makes it possible to overcome this drawback.

The method described in the example of FIG. 1 comprises in particular initially thinning the passive components (step 10, optional), positioning and fixing at least one active component and one passive component on a flat support (step 11), depositing a polymer layer on all of the support and the components (step 12), rectifying the layer (step 13, optional) allowing the surface of the layer to be rendered substantially plane and parallel to the support, removing the support (step 14), redistributing the terminals between the components and/or toward the periphery by means of metal conductors (step 15), making it possible to obtain a reconstituted heterogeneous structure, thinning said structure by heterogeneous surface treatment consisting in nonselective polishing of the polymer layer and at least one passive component (step 16).

The first step of the method according to the invention, referenced 11 in FIG. 1, consists in the components, which are provided with terminals for their interconnection and intended to be connected together, being positioned and fixed on a flat support.

Figure 2A:
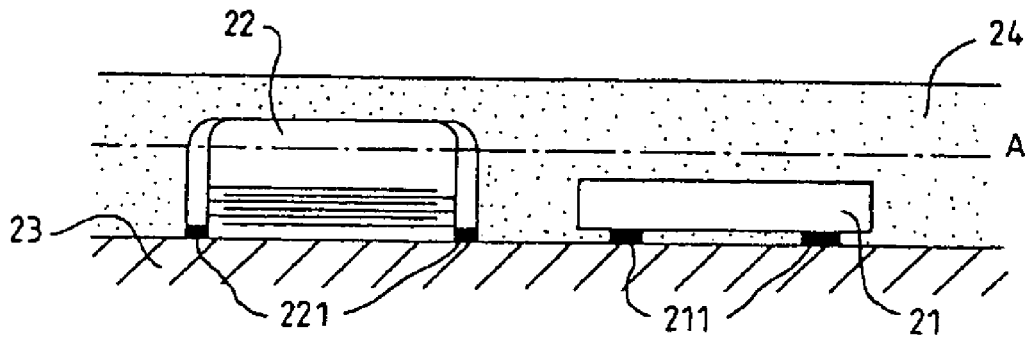
FIGS. 2A, 2B and 2C represent exemplary embodiments of the steps of the method according to FIG. 1.
Figure 2B:
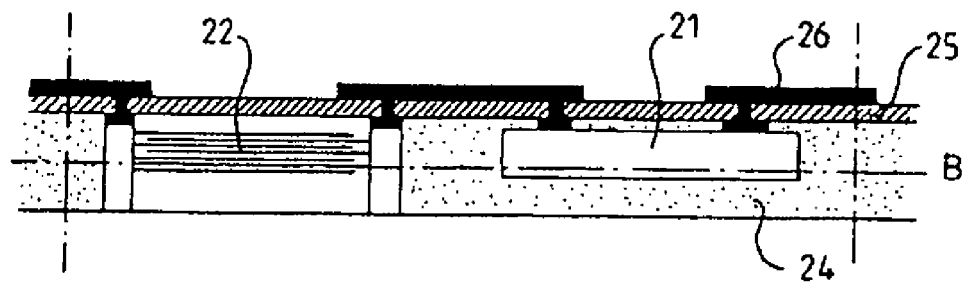
Figure 2C:
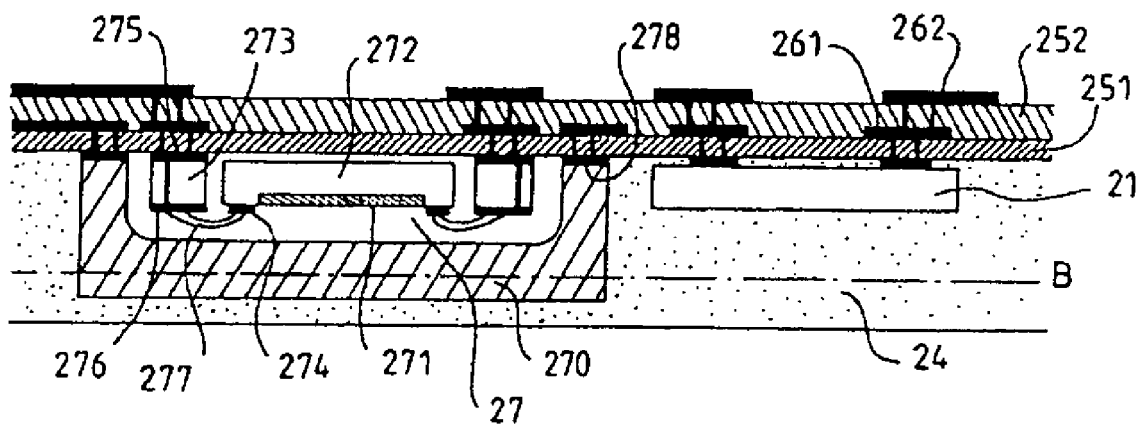

FIGS. 2A and 2B illustrate steps of the method described in FIG. 1 according to an exemplary embodiment. For simplicity, the connection of an active component referenced 21, of a first passive component, for example a conducting wire 20, and of a second passive component referenced 22, in this example a ceramic capacitor, is described in these figures. FIG. 2C describes the connection of an active component and a passive component of the MEMS type denoted by 27. These components are positioned and fixed on a support 23. The terminals of the components, respectively referenced 211 for the active component and 221 for the ceramic capacitor, are in contact with the support. In practice, for reasons of optimizing the method, a large number of components arranged in the form of substantially identical patterns may be positioned and fixed on the support 23. The method is then applied collectively to all of the support, and the reconstituted structure (or reconstituted "wafer") obtained at the end of the method will be cut in order to obtain a corresponding number of individual heterogeneous components.

The support 23 is advantageously an adhesive film which can be taken off without any particular treatment, for example a polyvinyl chloride film of the type used in the fabrication of silicon "wafers" and commonly referred to as a drum skin. The positioning of the components, which is very precise, is carried out for example using optical control by a camera with reference points as markers. Using an adhesive film as a support makes it possible to avoid bonding the components with glue, which is more complicated to do because the drop of glue must be extremely well calibrated and thin so as not to touch the points, and is more limited in terms of application possibilities because the points must necessarily lie at the periphery of the component. An adhesive film can furthermore be removed by peeling without any particular treatment, while fixing the support by bonding requires a heat treatment in order to polymerize the glue and a chemical treatment with acid in order to remove it.

Figure 3A:
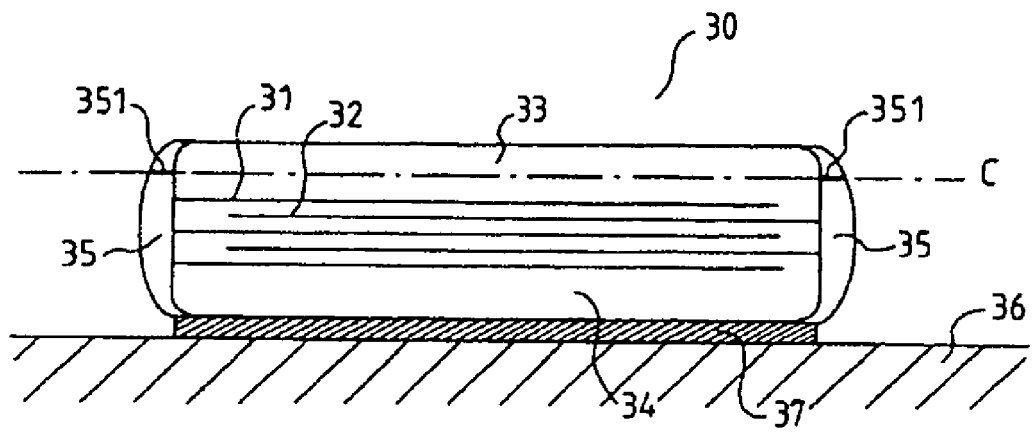
FIGS. 3A and 3B represent exemplary embodiments of the prior step of thinning on ceramic capacitors.

In the exemplary embodiment illustrated in FIGS. 2A and 2B, the ceramic capacitor 22 has undergone a prior thinning step described by means of FIG. 3A. This step, which is optional, makes it possible to thin the ceramic capacitor on two opposing faces and thus further reduce its thickness. The ceramic capacitor (30) comprises in the conventional way a zone of even and odd interdigitated plane electrodes, respectively referenced 31 and 32, two ceramic filling zones 33 and 34 lying on either side of the electrode zone, which are not electrically functional, and two end terminals referenced 35 (generally of silver-palladium or nickel-gold) to which, for example, the even electrodes 31 and odd electrodes 32 are respectively connected. The ceramic capacitor is thinned on one of its faces, for example by polishing.

According to a first variant represented in FIG. 3A, the capacitor is thinned on a face parallel to the electrodes. To this end, for example, the capacitor is bonded onto a support 36 by means of an adhesive material which can be easily taken off, for example wax 37 or a bonding film as described above. The polishing may take place in the zones 33 and 34 which are not electrically functional. Thus, the example of FIG. 3A shows the capacitor thinned in the ceramic zone 33 on the section plane referenced C. If this is necessary, however, the Applicant has shown that it is possible to thin in the electrode zone. Naturally, the capacitive value will decrease as the electrode levels are reduced. For reasons of reliability, care will be taken to stop the polishing at the level of an electrode or at the level of the underlying dielectric. Optical control may be carried out in order to check that the thinning does not take place askew relative to the plane of the electrode. The very low cost of ceramic capacitors (10 to 100 times less than that of deposited capacitors) makes it possible to sort the components once thinned and keep only the good ones, by nondestructive and instantaneous techniques for testing the reliability of ceramic capacitors which are known to the person skilled in the art. The thinned capacitors are subsequently detached, then they can be transferred onto the support 23 (FIG. 2A) with the thinned face pointing toward the support so that the sections 351 of the end terminals (FIG. 3A) fulfill the function of terminals 221 of the passive component.

Figure 3B:
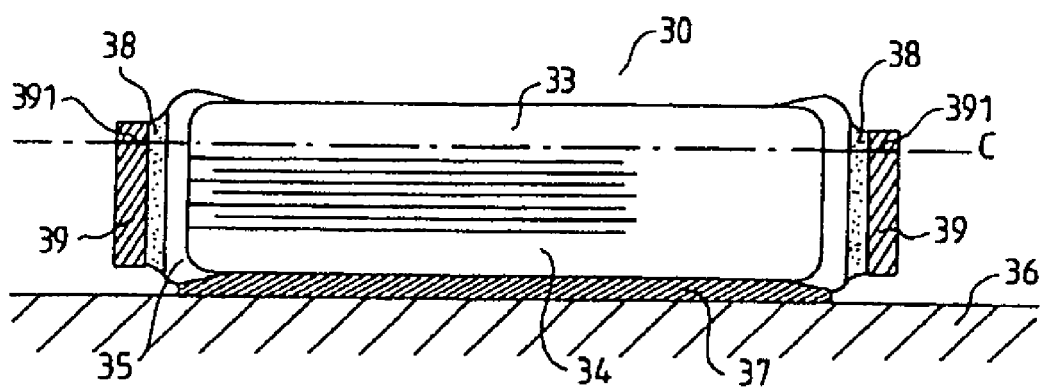

FIG. 3B illustrates the case of initially thinning a ceramic capacitor with an attached electrode. In fact, ceramic capacitors may have end terminals 35 of a material incompatible with the metallization which will be applied during the step of redistributing the terminals (step 15 described below) and which is fixed by chip terminal metallization technology. It may thus be necessary to process the thinned capacitors with non-oxidizable metals or alloys (for example gold or gold-palladium). In the exemplary embodiment described in FIG. 3B, electrodes 39 in the form of a strip or wire are bonded to the end terminals 35 by means of conductive adhesive (for example containing silver) or by brazing. After thinning (cut C), the non-oxidizable electrodes 39 have sections 391 which can fulfill the function of terminals 221 of the passive component (FIG. 2A).

According to a second variant, the capacitor may be thinned on one of its faces perpendicular to the plane of the electrode, which reduces the capacitive value but makes it possible to maintain the positioning symmetry of the electrodes with respect to the faces that are parallel to them. The external metallizations 35 of the electrodes are extended on the four adjacent faces, and the capacitor may be bonded onto the adhesive support 23 via the ends of the metallizations 35 with the electrodes parallel or perpendicular to the plane of the support.

Figure 4:
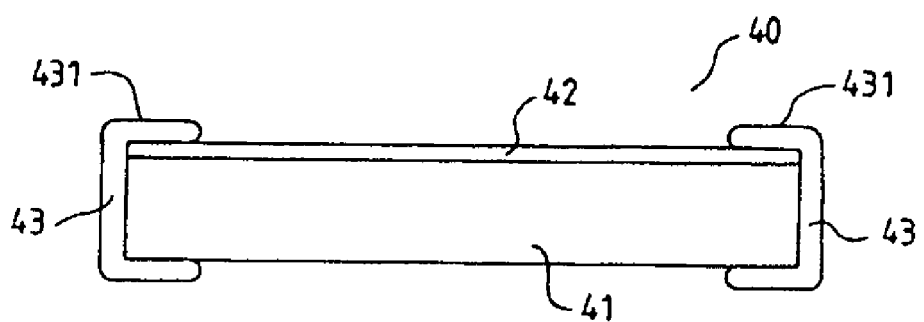
FIG. 4 represents the diagram of a resistor to which the method according to the invention may be applied.

The interconnection method according to the invention applies of course to the interconnection of other passive components. FIG. 4 represents the diagram of a commercial passive component of the resistor type, to which the invention may be applied.

The resistor 40 comprises an inert substrate 41, for example of alumina, the thickness of which is of the order of one millimeter, a resistive layer 42 (of the order of 1 micron) and conductive terminals 43 generally formed by layers of conductive material which enclose the side faces of the component, on either side of the active layer. The active layer 42, which is very thin, is positioned in proximity to one face for this type of component. The prior thinning of the component is possible on the face opposite that bearing the active layer. The active component is subsequently positioned and fixed on the substrate with the face bearing the active layer pointing toward the substrate. During the interconnection method according to the invention, the component is positioned on the support 23 (FIG. 2A) via its terminals 43 with the active layer on the support side, so that the thinning (step 16 of the method, described below) can take place in the inert layer. The zones 431 of the terminals 43 in contact with the support 23 form the terminals 221 of the component (FIG. 2A).

The invention likewise applies to a component of the inductor type, the active layer then being an inductive layer.

The next step, referenced 12, consists in depositing a polymer layer (referenced 24 in FIGS. 2A, 2B), for example epoxy resin, on all of the components and the support.

The rectification of the polymer layer (step 13) is an optional step of the interconnection method according to the invention, which is particularly beneficial in the event that the method is applied collectively to a reconstituted wafer. This is so because it makes it possible to render the surface of the layer substantially plane and parallel to the support 23, and to give the structure a calibrated thickness (typically 0.8 nm) compatible with the machines conventionally used for the subsequent step of redistributing the terminals on silicon wafers. The rectification, indicated by A in FIG. 2A, consists in lapping optionally followed by polishing. The Applicant has shown that, if the thickness of the components so requires, in particular passive components, it is possible to carry out heterogeneous i.e. nonselective thinning which leads to a cut in the thickness of the structure through the various materials formed by the diversity of the components and the layer.

The support 23 (step 14) is subsequently removed in order to redistribute the terminals (step 15). Advantageously, the support being formed by an adhesive film, the removal is carried out simply by peeling the film.

The redistribution of the terminals is intended to connect together the components of the same pattern and/or make connections toward the periphery of the pattern with a view to subsequent three-dimensional interconnection. FIG. 2B illustrates an advantageous embodiment of this step. The support 23 being removed, a layer 25 of an insulation material of the photo-etchable polymer type or an etchable resist, on which a polymer layer of the photoresist© type is deposited, is deposited on all of the surface. The pattern corresponding to the layout of the terminals 221 is etched into the polymer layer by exposure through a mask. A metal layer is subsequently deposited, and then the metal layer is likewise etched by a similar technique according to a predetermined pattern of connections in order to form the metal conductors 26 which connect the component toward another component and/or toward the periphery. In certain cases of complex connections, several metal layers may be deposited on one another. The choice of the metal must be compatible with the material from which the terminals 221 of the passive and active components are formed. For example, the metal is an alloy of the conventionally used trilayer type having layers of titanium-tungsten, nickel and gold.

A reconstituted heterogeneous structure is obtained at the end of this step. The next step, referenced 16, then consists in thinning this structure by heterogeneous surface treatment, that is to say plane nonselective cutting in the thickness of the structure through the various materials formed by the diversity of the components and the layer. The cut denoted B in FIG. 2B is thus made through the polymer forming the layer 24, the material forming the passive component, for example ceramic for a capacitor as described in FIG. 2B, or alumina in the case of a resistor, and optionally the silicon forming the support of the active component. In practice, the cut is made by lapping followed by nonselective polishing of the surface of the structure. The lapping and polishing are advantageously carried out by mechanical abrasion, a method which is widely used in the field of semiconductors and inexpensive.

A thin heterogeneous structure is then obtained, which can be cut (step 17) in order to form ultrathin heterogeneous elementary components. The components thus obtained are two-dimensional. They may be used per se in order to produce two-dimensional micropackages or, as described below, for stacking in three dimensions.

MEMS constitute another particularly advantageous case of a passive component to which the interconnection method according to the invention may be applied. MEMS are electromechanical components etched in silicon and having functions of the sensor type, actuator type, switch type etc. Being very sensitive to humidity and external stresses, they are necessarily arranged in a cavity protected by a cover, for example of plastic. FIG. 2C illustrates the interconnection of a MEMS 27 and a chip 21 with the method according to the invention. The MEMS 27 comprises, protected by a cover 270, a sensitive part 271 etched in a substrate 272 generally of silicon. The substrate is positioned and bonded on the support 23 (not shown in FIG. 2C). The sensitive part is located on the substrate 272 on the opposite face from that in contact with the support, so that it does not need to receive adhesive or resin and remains unstressed. A substrate 273, made of alumina or of a printed circuit, that is to say one comprising an insulating film with a layer of copper coated with nickel and gold, etched on each of the 2 faces makes it possible to interface the chip and its substrate with the support 23 and to connect the sensitive part of the MEMS to the conductors of the heterogeneous component. The interface 273 has two faces equipped with metal contacts 275 and 276 respectively on the face next to the support 23, on which the interface is bonded, and on the opposite face, the contacts being connected together. The contacts 276 are connected to metal terminals 274 of the substrate 272, which is in contact with the sensitive surface 271, by connecting wires 277. After having interconnected the MEMS and the interface, the cover 270 which may consist of an organic (epoxy resin) or inorganic material (silicon, glass, ceramic such as alumina, metal or metal alloys) is "bonded" onto the interface 273. Care is taken for the thickness of the cover to be sufficient so that it can still maintain its integrity and form a protective cavity for the MEMS after the final thinning. According to the invention, the support is then removed in order to redistribute the terminals. The terminals are redistributed according to the method described above. The perimeter of the cover is not generally connected to anything. If it needs to be connected to an electrical ground for electrical shielding reasons, for example, it is sufficient to metallize its perimeter (metallization 278) if it is an insulator, or do nothing if it is conductive; the perimeter 278 will then be connected to terminals 279 of the interface 273. Two metallization layers 261 and 262 are thus provided in the example of FIG. 2C, deposited on two layers of insulating material 251, 252 which make it possible to ground the cover via its perimeter 278. The thinning (cut B) is carried out in the thickness of the cover.

Figure 5:
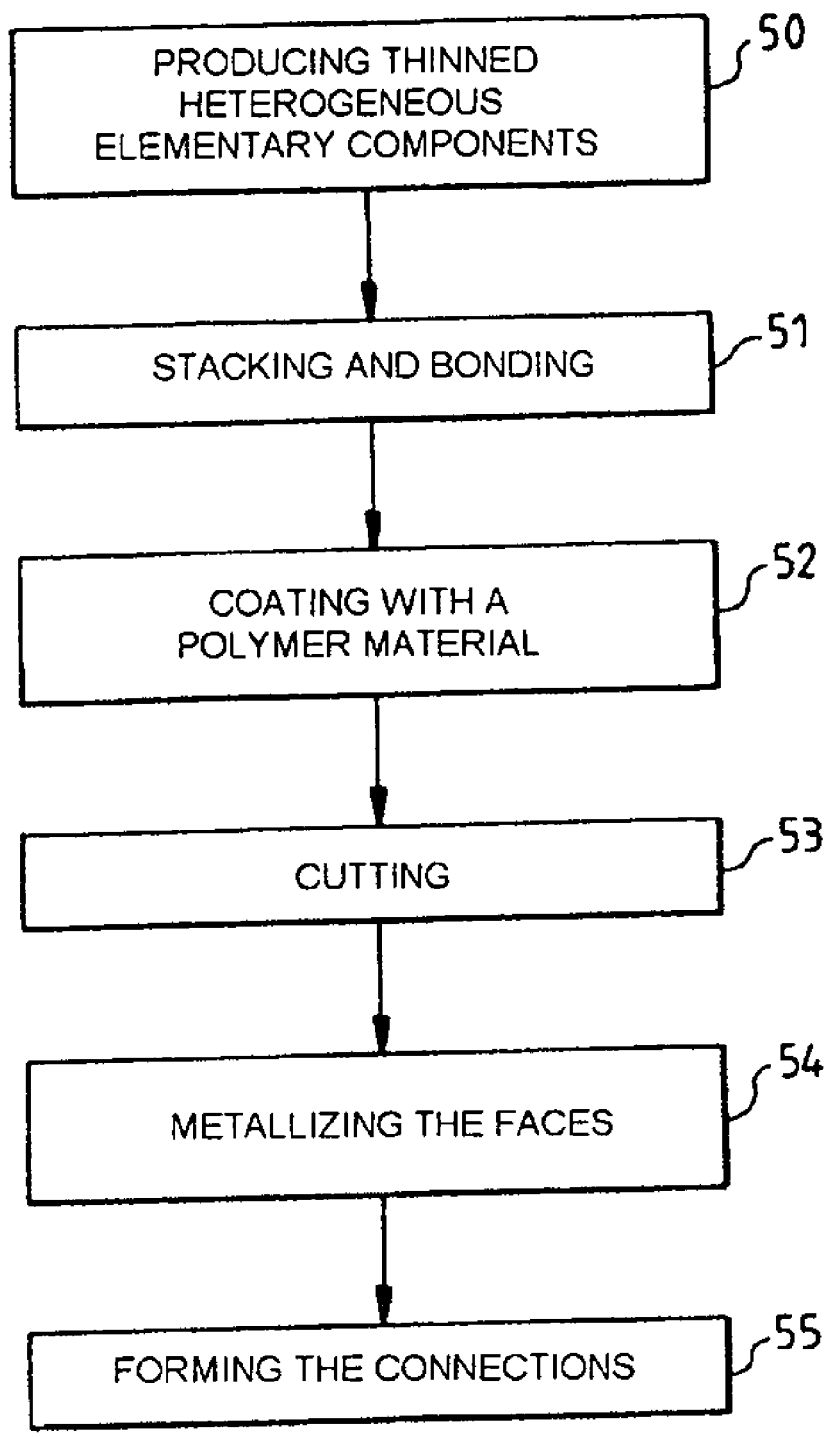
FIG. 5 represents the method according to the invention applied to interconnection in three dimensions.
Figure 6:
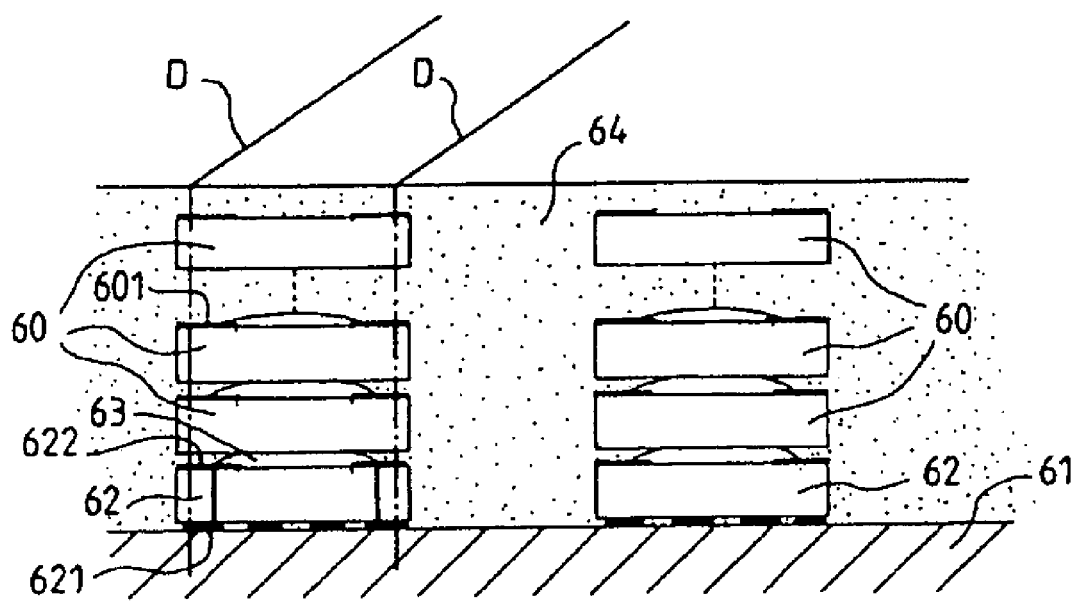
FIG. 6 represents a diagram illustrating the steps of the method described in FIG. 5.

According to an advantageous variant, the interconnection method as described above is applied to the production of three-dimensional thinned heterogeneous components. The method carried out in order to produce 3D components adopts the steps of the method described in French Patent Application No. 90 154 73 filed on Dec. 11, 1990 in the name of the Applicant. The steps are summarized in FIG. 5, and FIG. 6 illustrates the various steps according to one example. The production (50) of the thinned heterogeneous elementary components (denoted 60 in FIG. 6) is carried out by the interconnection method according to the invention as described above and illustrated in FIG. 1. A view in section of an example of a thinned heterogeneous elementary component thus produced is shown in FIG. 2B. The elementary components have, in particular, connections 601 (FIG. 6) oriented toward the periphery of the component. The components are then stacked and bonded (step 51) on a substrate 61. The components 60 are either identical components or components having different electrical functions. The substrate 61 is, for example, an adhesive film of the type described above. The first component 62 bonded onto the substrate is advantageously an interconnection component, for example a printed circuit substrate, for subsequent connection of the 3D components and comprising terminals 621 positioned on the face next to the substrate which are connected to terminals 622 positioned on the opposite face. The elementary components 60 are therefore stacked on this first interconnection component and bonded, for example by means of an epoxy adhesive 63. The assembly formed by the stack of elementary components 60 and the interconnection component 62 is coated (step 52, FIG. 5) with a polymer material 64 (for example an epoxy resin) in order to form a block of parallelepipedal shape. The faces of this block are then metallized in order to form the connections (step 54). The method employed is advantageously a collective method. On a single substrate 61, the individual heterogeneous components are stacked and bonded on one another as described above. The coating material is applied on all of the support, then the structure obtained is cut (step 53) so as to expose the sections of all the conductors (601, 622) arriving at the periphery for each of the levels consisting of the elementary components 60 and the interconnection component 62. The faces of this block are subsequently metallized on 4 or 5 faces (step 54), short-circuiting all the conductors that reach the periphery of each level. An etching step, for example with a laser, then makes it possible to isolate groups of said conductors in order to form the electrical interconnection layout (step 55).

Figure 7:
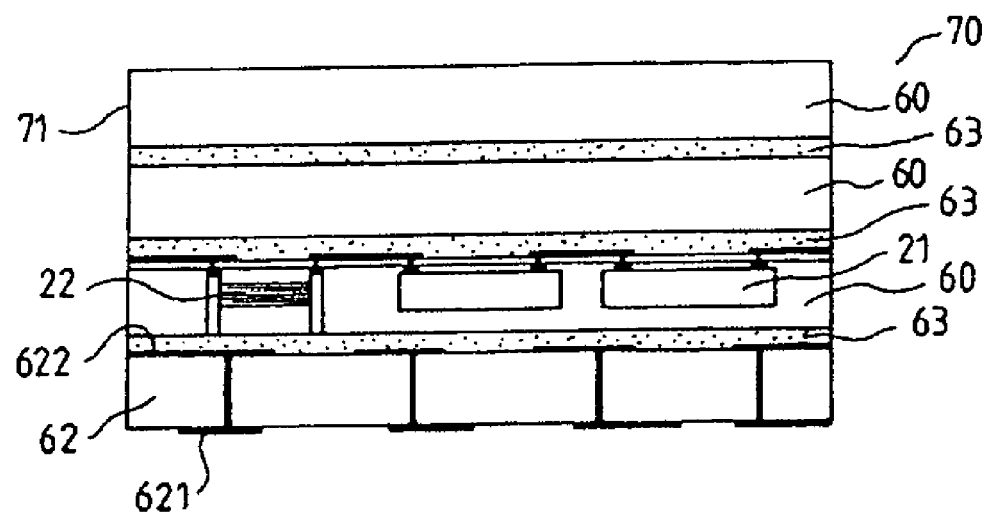
FIG. 7 represents a diagram showing a view in section of a thinned 3D heterogeneous component obtained by the method described by FIG. 5.

FIG. 7 illustrates a view in section of an exemplary embodiment of a three-dimensional thinned heterogeneous component obtained by the method as described in FIG. 5.

The thinned three-dimensional heterogeneous component comprises the interconnection component 62 with the terminals 621 for connection to the substrate onto which it will be transferred in order to be interconnected with others, and, stacked on it, the thinned heterogeneous elementary components 60 between which layers of glue 63 are arranged. The metallization layer 71 short-circuiting the conductors that reach the periphery of each level is deposited on the 4 or 5 faces of the three-dimensional component, making it possible to form an interconnection network between all the various levels after etching. Shown in the example illustrated in FIG. 7 are active 21 and passive 20, 22 components of the capacitor type and connecting wires 20, respectively. The advantage of such connecting wires 20 is that the various levels can be interconnected using a conductive layer 63, such an anisotropic adhesive of the ACF (anisotropic conductive film) type, either in liquid form or in film form, which is conductive in the direction in which pressure is applied.

Figure 8:
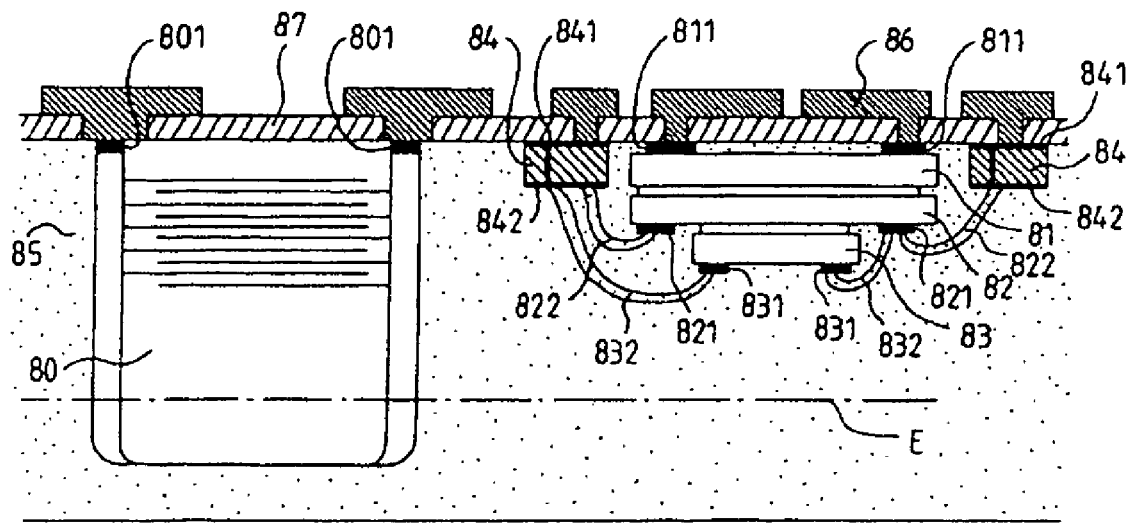
FIG. 8 represents a diagram illustrating the steps of a thin 3D interconnection method according to the invention in one variant.

FIG. 8 illustrates by a diagram another exemplary embodiment of the interconnection method according to the invention for the production of thinned three-dimensional components. The method substantially adopts the steps of the method described in FIG. 1. According to this example, however, a plurality of active components are stacked on one another before depositing the polymer layer (step 12, FIG. 1). This embodiment of the method according to the invention is particularly beneficial in the event that the active components have thicknesses small enough to be able to be stacked with a total stack height remaining less than the height of the passive component. The active components will thus not be touched during the step of heterogeneously thinning the structure, although nonselective surface treatment of the polymer layer and the passive components will be carried out making it possible to reduce the thickness of the heterogeneous component thus formed.

As before, the method described here comprises the positioning and fixing of at least one passive component 80 and at least a first active component 81 on a support, the terminals of the components (respectively 801, 811) being in contact with the support. This step, similar to one described in FIG. 2A, is not represented in FIG. 8. The flat support is, for example, an adhesive film as described above. In contrast to the method described in FIG. 2A, the method furthermore comprises the stacking and bonding of a second active component 82 on the first active component 81, the terminals 821 of the second component being on the opposite face from that in contact with the first component. One or more other active components 83 may optionally also be stacked on the second component, the terminals 831 of each further active component being on the opposite face from that in contact with of the lower component. The number of active components which can be stacked depends on their thickness with respect to that of the passive component 80. According to the invention, the active components are connected in the following way. According to this variant, one or more terminal adapters 84 are positioned and fixed on the flat support (not shown) in the same way as the passive component 80 and the first active component 81. The adapters may be of the same type as those described above (FIG. 2C). Each adapter has two faces with metal contacts connected together, respectively denoted 841 on the face in contact with the support and 842 on the other face on the opposite side. The adapters 84 may be formed by a metal grid. The metal grid coated in a resin consists, for example, of a ferro-nickel alloy or copper. It is coated with nickel and gold so as to be able to receive the wiring. The method comprises the formation of connections by means of wires 822 between the terminals 821 of the second component 82 and the contacts 842 of the adapter and, if appropriate, the formation of connections by connecting wires 832 between the terminals of each further component 83 and the contacts 842 of the adapter or the terminals of the lower component, here the terminals 821 of the second component 82. The subsequent steps of the method are similar to those described in the example of FIG. 1 and comprise depositing a polymer layer 85 of all of the support and the components, removing the support, then redistributing the terminals between the components and/or toward periphery by means of metal conductors 86, making it possible to obtain a reconstituted 3D heterogeneous structure. This structure is then subjected to heterogeneous thinning by nonselective surface treatment of the polymer layer and the passive components (cut denoted E in FIG. 8). The active components are not thinned during the heterogeneous thinning step in this case, all of these components being assumed to be thin enough per se. The redistribution of the terminals in this example is carried out in the same way as described on the basis of FIG. 2B, with the deposition of a photo-etchable insulating layer (87, FIG. 8), etching of the layer in a pattern corresponding to the positioning of the terminals (801, 811, 841), the deposition of a metal layer and then etching of the metal layer according to the desired layout of the metal conductors.

As before, the passive components may undergo a prior thinning step. The method may furthermore be applied collectively by fixing a large number of components arranged in the form of identical patterns on the same support. The reconstituted structure obtained at the end of the method will then be cut in order to obtain a corresponding number of individual heterogeneous components.

The invention claimed is:

1. A method for fabricating an interconnection of active and passive components provided with terminals for their interconnection, comprising the steps of:
- thinning the passive components;
- positioning and fixing the active and passive components on a flat support, the terminals being in contact with the support;
- depositing a polymer layer on all of the support and the components;
- removing the support;
- rectifying and pre-thinning the polymer layer to calibrate the thickness of the layer to a predetermined value and render the surface of said layer substantially flat and parallel to the support;
- redistributing the terminals between the components and/or toward the periphery by means of metal conductors arranged in a predetermined layout, to obtain a reconstituted heterogeneous structure; and
- thinning the structure by nonselective surface treatment of the polymer layer and at least one passive component; and
- wherein, the passive component is a ceramic capacitor with a zone of even and odd interdigitated electrodes, two ceramic filling zones on either side of the electrode zone and two lateral end terminals to which the even and odd electrodes are respectively connected, the prior thinning step consists in thinning on one of its faces perpendicular to the plane of the electrodes.

2. The method as claimed in claim 1, wherein the nonselective surface treatment is carried out by nonselectively lapping and polishing the polymer layer and the components.

3. The method as claimed in claim 1, wherein the support includes an adhesive film and the removal is carried out by peeling the film.

4. The method as claimed in claim 1, wherein said redistributing of the terminals step comprises depositing a photo-etchable insulating layer, etching said layer in a pattern corresponding to the positioning of the terminals, depositing a metal layer and etching said metal layer according to the predetermined layout of the metal conductors.

5. The method as claimed in claim 1, wherein, the active and passive components are arranged on the support in order to form a set of identical patterns, furthermore comprising cutting the thinned heterogeneous structure around said patterns, to obtain a corresponding number of identical thinned heterogeneous elementary components.

6. A method for fabricating an interconnection of active and passive components provided with terminals for their interconnection, comprising the steps of:
- thinning the passive components;
- positioning and fixing the active and passive components on a flat support, the terminals being in contact with the support;
- depositing a polymer layer on all of the support and the components;
- removing the support;
- rectifying and pre-thinning the polymer layer to calibrate the thickness of the layer to a predetermined value and render the surface of said layer substantially flat and parallel to the support;
- redistributing the terminals between the components and/or toward the periphery by means of metal conductors arranged in a predetermined layout, to obtain a reconstituted heterogeneous structure; and
- thinning the structure by nonselective surface treatment of the polymer layer and at least one passive component; and
- wherein, the passive component is a resistor or an inductor with an inert substrate, an active layer on one face of said substrate and conductive terminals enclosing the side faces of the component on either side of the active layer, the prior thinning step includes thinning said substrate, the face bearing the active layer being next to the support during the positioning of the passive components on the support.

7. A method for fabricating an interconnection of active components and passive components provided with terminals for their interconnection, comprising the steps of:
- positioning and fixing the active and passive components on a flat support, the terminals being in contact with the support;
- depositing a polymer layer on all of the support and the components;
- removing the support;
- redistributing the terminals between the components and/or toward the periphery by means of metal conductors arranged in a predetermined layout, to obtain a reconstituted heterogeneous structure; and
- thinning the structure by nonselective surface treatment of the polymer layer and at least one passive component, the at least one passive component comprising a MEMS with a sensitive part in contact with metal contacts and etched in a substrate; comprising:
- positioning and fixing said substrate on the support via an interface with two faces having a first and second metal contact which are connected together and respectively placed on the face next to the support on which the interface is fixed and on the opposite face, said second contact being connected to the metal terminals of the substrate by connecting wires; and
- positioning and fixing a protective cover of the MEMS on the support.

8. The method as claimed in claim 7, comprising a step of rectifying and pre-thinning the polymer layer prior to the step of redistributing the terminals, to calibrate the thickness of the layer to a predetermined value and render the surface of said layer substantially flat and parallel to the support.

9. The method as claimed in claim 8, wherein said rectifying and pre-thinning step comprises thinning the layer by nonselective surface treatment of the polymer layer and the passive component.

* * * * *